(12) United States Patent
Jackson et al.

(10) Patent No.: US 10,526,198 B2
(45) Date of Patent: Jan. 7, 2020

(54) INFRARED SENSOR DESIGN USING AN EPOXY FILM AS AN INFRARED ABSORPTION LAYER

(75) Inventors: Ricky Alan Jackson, Richardson, TX (US); Walter Baker Meinel, Tucson, AZ (US); Kalin Valeriev Lazarov, Tucson, AZ (US); Brian E. Goodlin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 337 days.

(21) Appl. No.: 13/411,849

(22) Filed: Mar. 5, 2012

(65) Prior Publication Data
US 2012/0223400 A1 Sep. 6, 2012

Related U.S. Application Data

(60) Provisional application No. 61/449,296, filed on Mar. 4, 2011.

(51) Int. Cl.
*B81B 7/00* (2006.01)
*H01L 27/144* (2006.01)
*B81C 1/00* (2006.01)

(52) U.S. Cl.
CPC .......... *B81B 7/0019* (2013.01); *B81C 1/0069* (2013.01); *B81C 1/00801* (2013.01); *H01L 27/144* (2013.01); *B81C 1/0038* (2013.01); *B81C 1/00523* (2013.01)

(58) Field of Classification Search
CPC ...... G01J 5/12; G01J 5/22; G01J 5/046; G01J 5/08; G01J 5/0803; B81B 2201/014; B81B 7/0019; B81C 1/0038; B81C 1/00523; B81C 1/0069; B81C 1/00801; H01L 27/144; H01L 2924/15; H01L 2924/15153; H01L 2924/15155; B41N 10/02; B41N 10/04; B41N 2210/02; B41N 2210/04; B41N 2210/10; H03H 2007/006

See application file for complete search history.

(56) References Cited

U.S. PATENT DOCUMENTS 6,212,317 B1 * 4/2001 Takeshita et al. .............. 385/33
8,047,074 B2 * 11/2011 Jun ....................... G01N 27/121
73/31.06

(Continued)

OTHER PUBLICATIONS

Uwe Stohr et al. "High-Resolution permanent photoresist laminate for microsystem applications." Journal of Micro/Nanolithography, MEMS and MOEMS vol. 7 (3) (2008). 033009-1.*

*Primary Examiner* — Matthew C Landau
*Assistant Examiner* — Priya M Rampersaud
(74) *Attorney, Agent, or Firm* — Jacqueline J. Garner; Charles A. Brill; Frank D. Cimino

(57) ABSTRACT

A MEMS IR sensor, with a cavity in a substrate underlapping an overlying layer and a temperature sensing component disposed in the overlying layer over the cavity, may be formed by forming an IR-absorbing sealing layer on the overlying layer so as to cover access holes to the cavity. The sealing layer is may include a photosensitive material, and the sealing layer may be patterned using a photolithographic process to form an IR-absorbing seal. Alternately, the sealing layer may be patterned using a mask and etch process to form the IR-absorbing seal.

12 Claims, 17 Drawing Sheets

(56) References Cited

U.S. PATENT DOCUMENTS

| | | | | |
|---|---|---|---|---|
| 2009/0072398 A1* | 3/2009 | Irsigler | ............... | H01L 23/5389 |
| | | | | 257/741 |
| 2009/0104572 A1* | 4/2009 | Gao | ................... | B41M 5/38207 |
| | | | | 430/348 |
| 2009/0151429 A1* | 6/2009 | Jun | ....................... | G01N 27/128 |
| | | | | 73/31.06 |
| 2010/0154985 A1* | 6/2010 | Tominaga | ............... | B41J 2/1603 |
| | | | | 156/245 |
| 2010/0200898 A1* | 8/2010 | Lin et al. | ....................... | 257/294 |
| 2010/0213374 A1* | 8/2010 | Meinel | ....................... | G01J 5/12 |
| | | | | 250/338.4 |
| 2010/0289108 A1* | 11/2010 | Meinel | ................. | H01L 21/764 |
| | | | | 257/467 |
| 2010/0327393 A1* | 12/2010 | Meinel | ............... | B81C 1/00047 |
| | | | | 257/467 |
| 2011/0206861 A1* | 8/2011 | Saito | ....................... | B41J 2/1603 |
| | | | | 427/532 |

* cited by examiner

INFRARED SENSOR DESIGN USING AN EPOXY FILM AS AN INFRARED ABSORPTION LAYER

CROSS-REFERENCE TO RELATED APPLICATIONS

This application claims the benefit of priority under U.S.C. § 119(e) of U.S. Provisional Application 61/449,296.

The following co-pending patent applications are related and hereby incorporated by reference:

U.S. patent application Ser. No. 13/411,861, filed Mar 5, 2012 entitled "CAVITY PROCESS ETCH UNDERCUT MONITOR,"

U.S. patent application Ser. No. 13/411,871, filed Mar. 5, 2012 entitled "CAVITY OPEN PROCESS TO IMPROVE UNDERCUT,"

U.S. patent application Ser. No. 13/412,562, filed Mar. 5, 2012 entitled "BACKGRIND PROCESS FOR INTEGRATED CIRCUIT WAFERS," and U.S. patent application Ser. No. 13/412.563, filed Mar 5, 2012 entitled "SENSOR COVER FOR INTEGRATED SENSOR CHIPS."

FIELD OF THE INVENTION

This invention relates to the field of microelectronic mechanical systems (MEMS) devices. More particularly, this invention relates to three-dimensional structures in MEMS devices.

BACKGROUND OF THE INVENTION

A microelectronic mechanical system (MEMS) infrared (IR) sensor may have a cavity in a substrate underlapping an overlying layer. A temperature sensing component may be disposed in the overlying layer over the cavity, so that the cavity provides thermal isolation between the temperature sensing component and the substrate. It may be desirable to prevent foreign material from entering the cavity, for example through an access hole in the overlying layer, during fabrication steps of the IR sensor subsequent to forming the cavity.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A MEMS IR sensor, with a cavity in a substrate underlapping an overlying layer and a temperature sensing component disposed in the overlying layer over the cavity, may be formed by forming an IR-absorbing sealing layer on the overlying layer so as to cover access holes to the cavity. The sealing layer is subsequently patterned using a photolithographic process and possibly an etch process to form an IR-absorbing seal which prevents foreign material from entering the cavity.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A MEMS IR sensor, with a cavity in a substrate underlapping an overlying layer and a temperature sensing component disposed in the overlying layer over the cavity, may be formed by forming an IR-absorbing sealing layer on the overlying layer so as to cover access holes to the cavity. The sealing layer is subsequently patterned using a photolithographic process and possibly an etch process to form an IR-absorbing seal which prevents foreign material from entering the cavity. The MEMS IR sensor may have an optional second temperature sensing component disposed in the overlying layer over the substrate adjacent to the cavity, and configured in a differential mode with the temperature sensing component disposed over the cavity, so that a sensor circuit in the MEMS IR sensor measures a temperature difference between the two temperature sensing components. The MEMS IR sensor may be used to detect a hot object emitting IR energy. The temperature sensing component disposed over the cavity has a higher thermal impedance to the substrate than the second temperature sensing component disposed over the substrate adjacent to the cavity. Disposing the IR-absorbing seal over the temperature sensing component provides that more IR energy from the hot object will be transferred to the temperature sensing component than to the second temperature sensing component. The combination of more IR energy transferred to the temperature sensing component and the higher thermal impedance to substrate for the temperature sensing component provides a higher temperature at the temperature sensing component than at the second temperature sensing component. Thus, the sensor circuit will measure a temperature difference related to the IR energy from the remote source.

For the purposes of this description, the term "substantially" is understood to mean within fabrication tolerances and irrespective of variations encountered during fabrication of embodiments.

Figure 1:
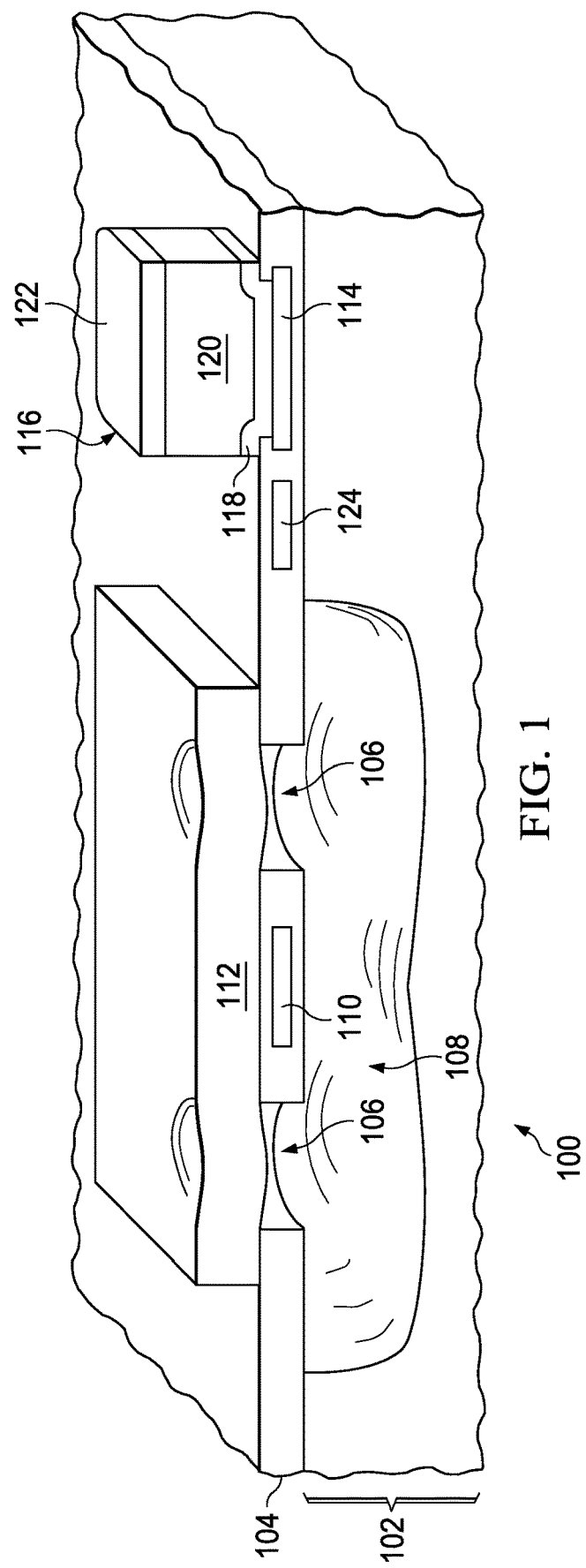
FIG. 1 is a cross section of a MEMS IR sensor formed according to an embodiment.

FIG. 1 is a cross section of a MEMS IR sensor formed according to an embodiment. The MEMS IR sensor 100 is formed in and on a substrate 102. An overlying dielectric layer 104 is formed over the substrate 102. The overlying dielectric layer 104 may include, for example, silicon dioxide and possibly silicon nitride or silicon oxynitride. Access holes 106 are formed through the overlying dielectric layer 104. The access holes 106 may have diameters of 10 to 25 microns. A cavity 108 is formed in the substrate 102 below the access holes 106. A temperature sensing component 110 is disposed in or on the overlying dielectric layer 104 over the cavity 108. The temperature sensing component 110 may include Seebeck junctions, thermocouple junctions, ferroelectric capacitors, thermistors, or other temperature sensing elements. Metal interconnects may be disposed in and/or on the overlying dielectric layer 104 to electrically connect the temperature sensing component 110 with circuitry outside the cavity 108.

An IR-absorbing seal 112 is formed over the overlying dielectric layer 104 so as to cover the access holes 106. The IR-absorbing seal 112 may be, for example, 10 to 20 microns thick, and absorbs at least 50 percent of infrared energy incident on the IR-absorbing seal 112 in a wavelength band of 8 to 10 microns. The IR-absorbing seal 112 includes organic polymer material, for example epoxy, which is resistant to strong solvents and oxidizing chemicals used in subsequent processing steps, such as plating mask removal and plating seed layer removal, and possibly filler material with high IR absorbing properties, such as carbon particles. The IR-absorbing seal 112 may possibly not extend to lateral edges of the cavity 108, may possibly be approximately coincident with the lateral edges of the cavity 108 as depicted in FIG. 1, or may possibly extend past the lateral edges of the cavity 108.

The overlying dielectric layer 104 may also contain an input/output (I/O) pad 114. A plated I/O bump 116 which includes a bump seed layer 118, a plated copper bump 120 and a plated metal cap layer 122 is formed on the I/O pad 114. The plated I/O bump 116 may be formed after the IR-absorbing seal 112 is formed.

Forming the IR-absorbing seal 112 so as to cover the access holes 106 may advantageously prevent foreign material from entering the cavity 108 during subsequent process steps such as singulation, in which adjacent instances of the MEMS IR sensor 100 are separated, commonly by sawing in the presence of a water stream. Forming the IR-absorbing seal 112 to absorb at least 50 percent of infrared energy incident on the IR-absorbing seal 112 in a wavelength band of 8 to 10 microns may advantageously improve a sensitivity of the MEMS IR sensor 100 to a desired value. Forming the IR-absorbing seal 112 to include organic polymer material which is resistant to solvents used in subsequent processing steps may advantageously improve a fabrication yield of the MEMS IR sensor 100.

The MEMS IR sensor 100 may include an optional second temperature sensing component 124 disposed over the substrate 102 adjacent to the cavity 108, so that the first temperature sensing component 110 has a larger thermal impedance to the substrate 102 than the second temperature sensing component 124. More IR energy from a remote source such as a hot object may be absorbed by the IR-absorbing seal 112 than by materials proximate to the second temperature sensing component 124, so that the first temperature sensing component 110 may have a higher temperature than the second temperature sensing component 124. A sensor circuit connected in a differential mode to the first temperature sensing component 110 and the second temperature sensing component 124 will measure a temperature difference related to an amplitude of the IR energy from the remote source.

Figure 2A:
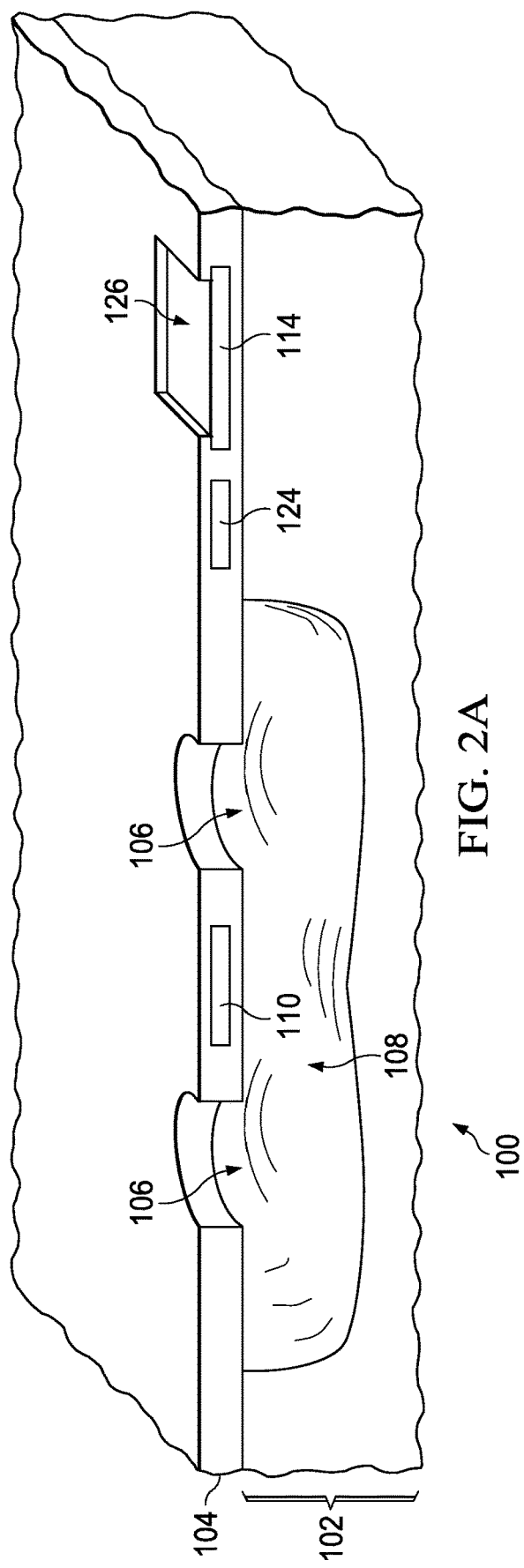
FIG. 2A through FIG. 2I are cross sections of the MEMS IR sensor as described in reference to FIG. 1, depicted in successive stages of fabrication.

FIG. 2A through FIG. 2I are cross sections of the MEMS IR sensor as described in reference to FIG. 1, depicted in successive stages of fabrication. Referring to FIG. 2A, the MEMS IR sensor 100 is formed in and on the substrate 102, which may be, for example, a silicon wafer. Electrical components of the MEMS IR sensor 100 such as transistors may be formed in and on the substrate 102. The overlying dielectric layer 104 is formed over the substrate 102, possibly covering the entire top surface of the substrate 102. The overlying dielectric layer 104 may include 3 to 10 microns of silicon dioxide formed by thermal oxidation of the substrate 102, decomposition of tetraethyl orthosilicate, also known as tetraethoxysilane or TEOS, and/or densification of methylsilsesquioxane (MSQ). The overlying dielectric layer 104 may also include one or more layers of silicon nitride and/or silicon oxynitride, 500 nanometers to 2 microns thick, formed by plasma-enhanced chemical vapor deposition (PECVD) at a top surface of the overlying dielectric layer 104 to provide, for example, a barrier to undesired contaminants.

During formation of the overlying dielectric layer 104, the temperature sensing component 110 is formed in or on the overlying dielectric layer 104. Additionally, metal interconnect lines may be formed in the overlying dielectric layer 104, for example to connect the temperature sensing component 110 to circuitry in the MEMS IR sensor 100. The optional I/O pad 114 may be formed during formation of the overlying dielectric layer 104.

The access holes 106 are formed through the overlying dielectric layer 104 proximate to the temperature sensing component 110, for example by forming an access hole etch mask over the overlying dielectric layer 104 and performing an access hole etch process which removes material from the overlying dielectric layer 104 so as to expose the substrate 102. The access hole etch process may include one or more reactive ion etch (RIE) steps which provide fluorine ions and other reactants into the access holes 106. If the optional I/O pad 114 is present, an I/O opening 126 which exposes the I/O pad 114 may be formed concurrently with the access holes 106.

The cavity 108 is formed in the substrate 102 by a cavity etch process performed after the access holes 106 are formed. The cavity etch process may be formed using a process sequence of forming a cavity etch mask over the overlying dielectric layer 104 which exposes the substrate 102 in the access holes 106 and exposing the MEMS IR sensor 100 to an isotropic ambient containing etchant species such as halogen radicals. The access hole etch mask may possibly be used for the cavity etch mask. The cavity 108 underlaps the access holes 106 by at least 5 microns.

Figure 2B:
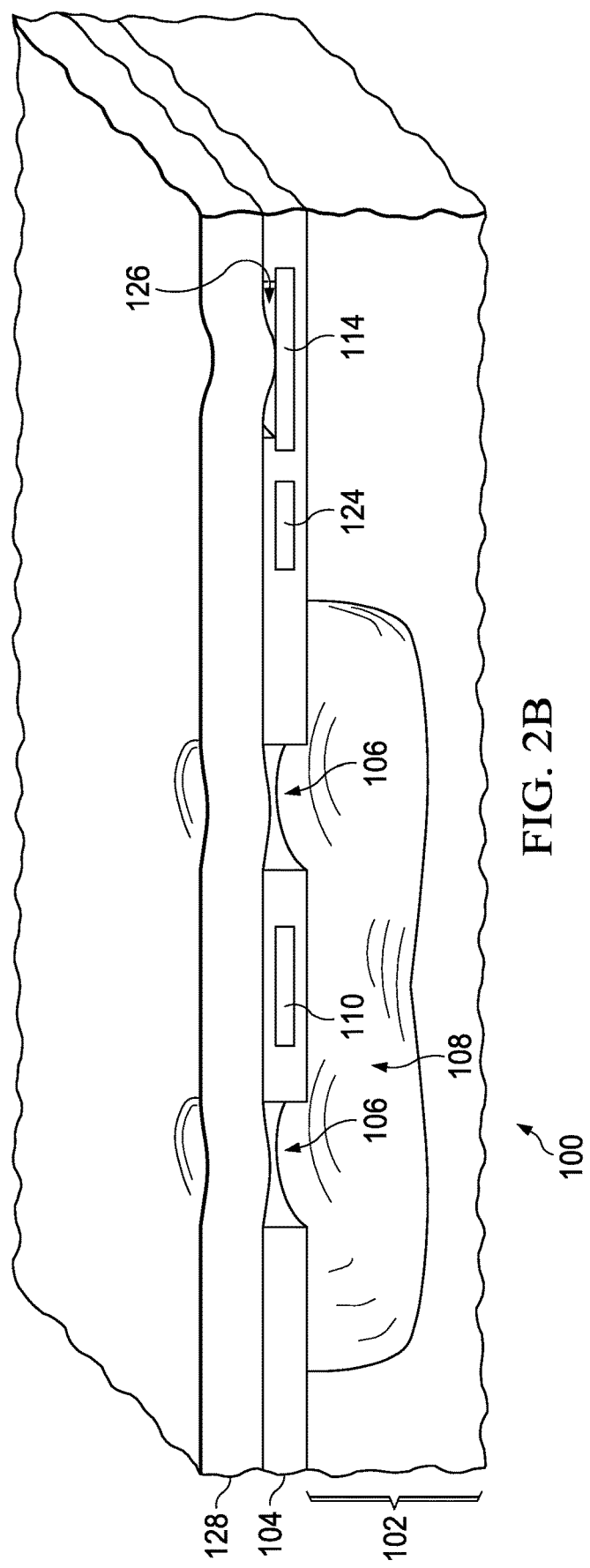

Referring to FIG. 2B, an IR-absorbing sealing layer 128 is formed over the overlying dielectric layer 104, covering the access holes 106. The IR-absorbing sealing layer 128 may possibly protrude into the access holes 106 as depicted in FIG. 2B, but does not extend into the cavity 108. The IR-absorbing sealing layer 128 may be 10 to 20 microns thick. The IR-absorbing sealing layer 128 includes adhesive material, IR absorbing material and photosensitive material. One component of the IR-absorbing sealing layer 128, for example epoxy, may provide the adhesive material and the IR absorbing material. The IR-absorbing sealing layer 128 may be have homogenous structure so that the adhesive material, IR absorbing material and photosensitive material are substantially uniformly distributed in the IR-absorbing sealing layer 128. The IR-absorbing sealing layer 128 absorbs at least 50 percent of infrared energy incident on the IR-absorbing sealing layer 128 in a wavelength band of 8 to 10 microns. The IR-absorbing sealing layer 128 may be formed over the overlying dielectric layer 104 by providing the IR-absorbing sealing layer 128 as a laminate between sheets of release film, removing a first release film from a bottom surface of the IR-absorbing sealing layer 128, applying the IR-absorbing sealing layer 128 to the overlying dielectric layer 104 so that the bottom surface of the IR-absorbing sealing layer 128 adheres to the overlying dielectric layer 104 and removing a second release film from a top surface of the IR-absorbing sealing layer 128. An example of the IR-absorbing sealing layer 128 provided in such a laminate form is the TMMF S2000 series of Permanent Photoresist products from Tokyo Ohka Kogyo Co., Ltd. Other methods of forming the IR-absorbing sealing layer 128 are within the scope of the instant embodiment.

Figure 2C:
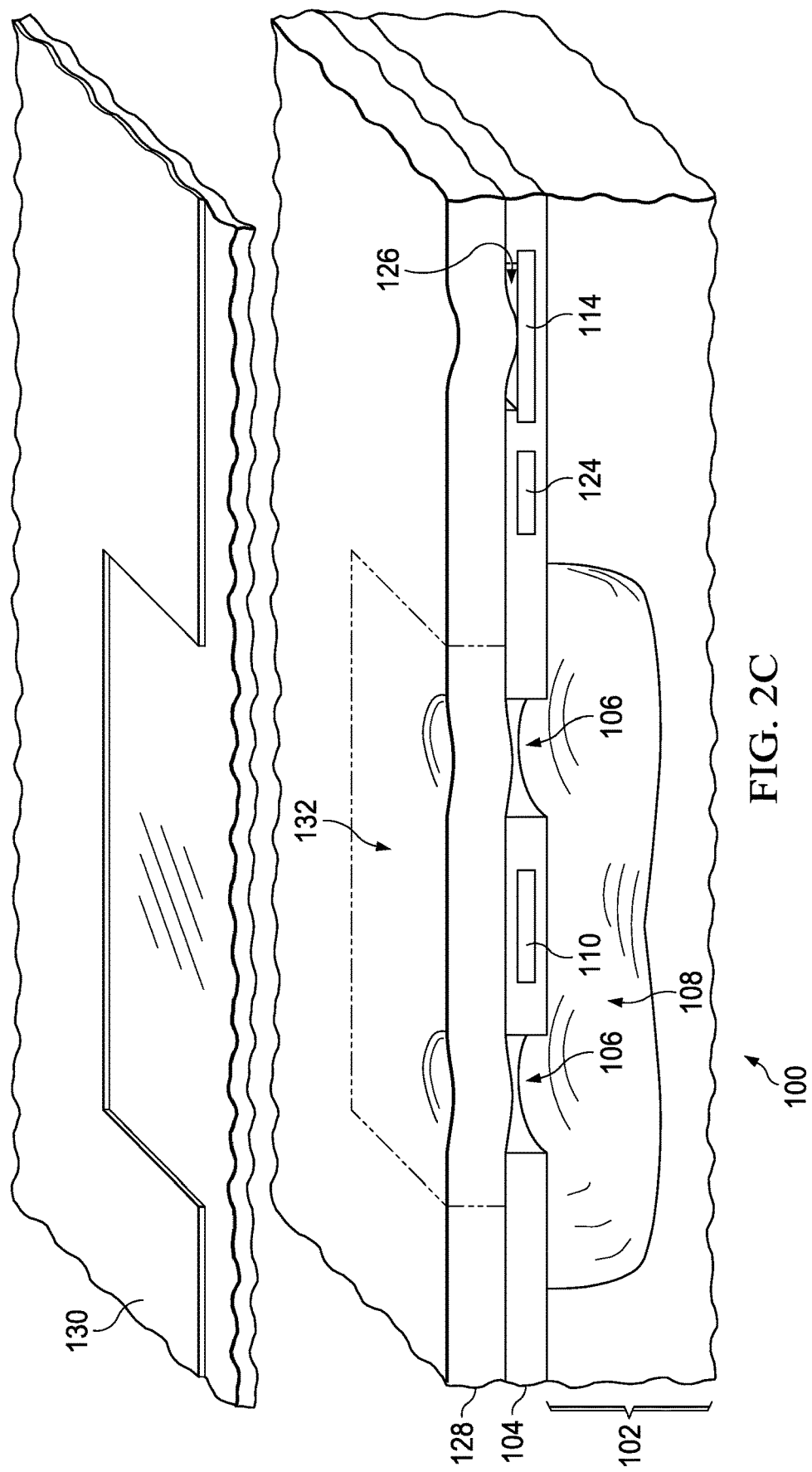

Referring to FIG. 2C, a lithographic exposure operation is performed in which ultraviolet light is provided through a photomask 130 so as to expose a portion 132 of the IR-absorbing sealing layer 128 in an area defined for the IR-absorbing seal 112 of FIG. 1. An exposure dose may be, for example, 100 to 200 millijoules/cm$^2$. Exposing the portion 132 of the IR-absorbing sealing layer 128 activates the photosensitive material in the IR-absorbing sealing layer 128 so as to cause the portion 132 to be less soluble in a subsequent develop operation than unexposed areas of the IR-absorbing sealing layer 128. After exposing the IR-absorbing sealing layer 128 to the ultraviolet light, the IR-absorbing sealing layer 128 may be baked, for example at 90° C. for 5 minutes, to remove byproducts of the exposure process from the IR-absorbing sealing layer 128.

Figure 2D:
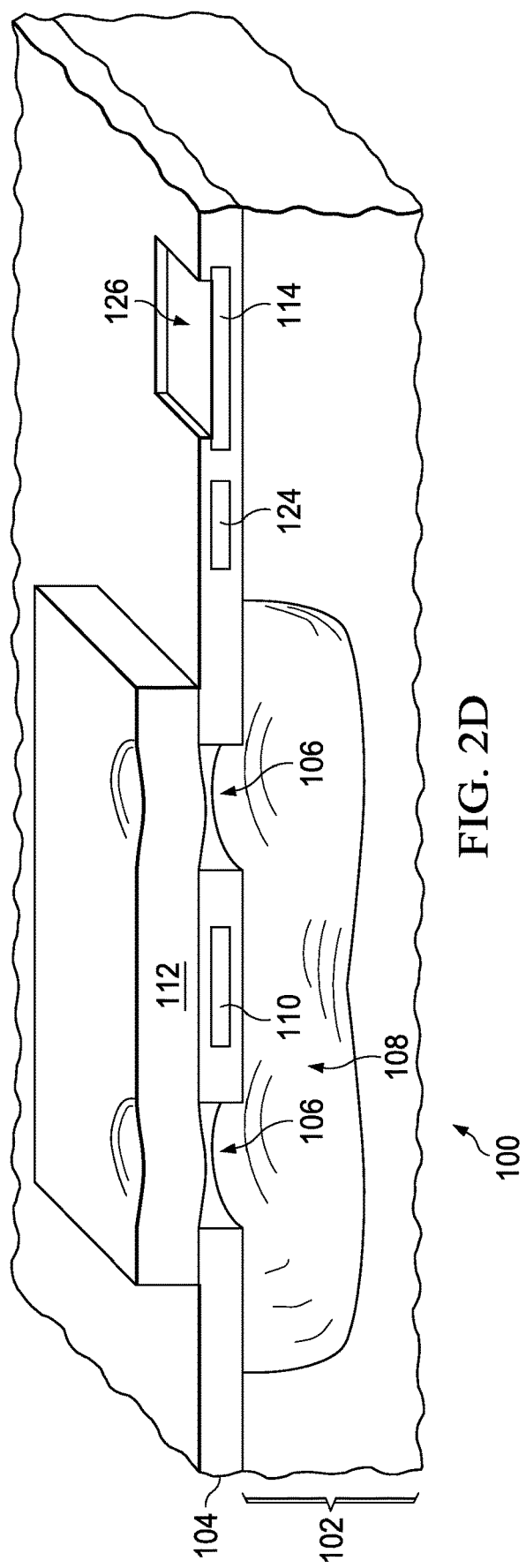

Referring to FIG. 2D, a develop operation is performed which provides a developer fluid, such as propylene glycol monomethyl ether acetate, also referred to as PM Thinner, to the IR-absorbing sealing layer 128. The develop operation may provide the PM Thinner to the IR-absorbing sealing layer 128, for example, at room temperature for 60 to 90 minutes. The develop operation dissolves unexposed material in the IR-absorbing sealing layer 128 in the developer fluid so as to leave the IR-absorbing seal 112.

Figure 2E:
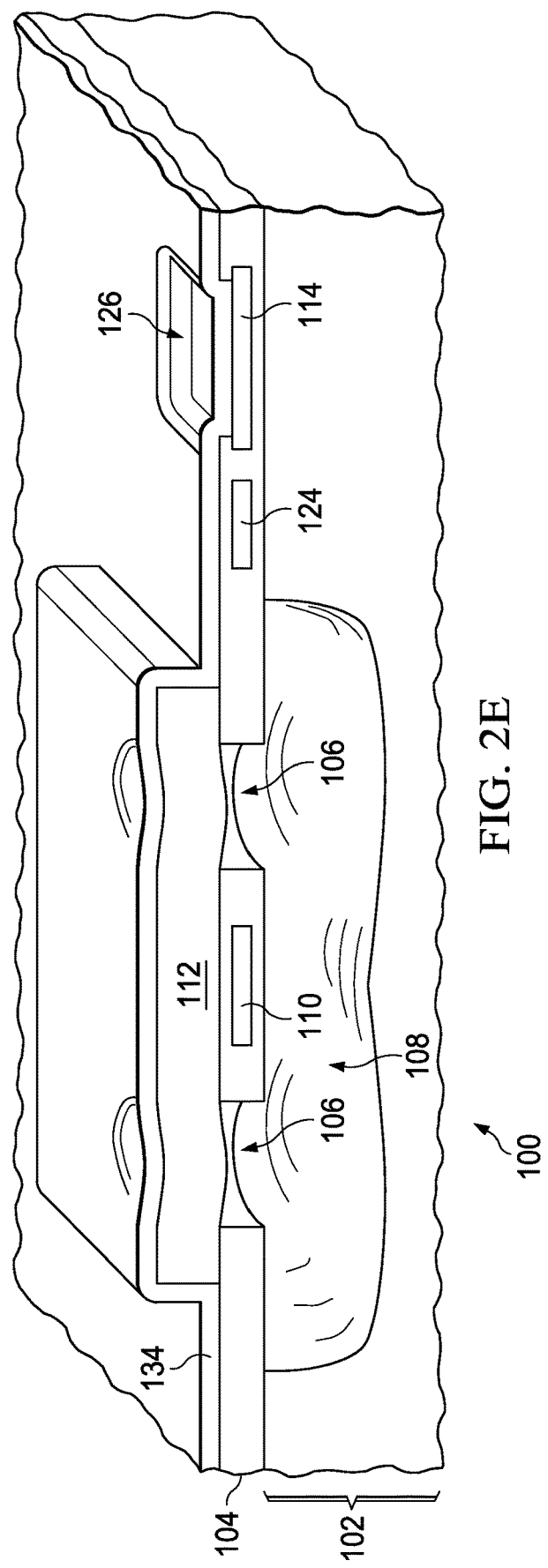

After formation of the IR-absorbing seal 112, the plated I/O bump 116 of FIG. 1 may be formed on the I/O pad 114, if present, in the I/O opening 126. FIG. 2E through FIG. 2I are cross sections of the MEMS IR sensor 100 depicting successive stages of forming the plated I/O bump 116. Referring to FIG. 2E, a metal seed layer 134 is formed over the MEMS IR sensor 100, so as to make electrical connection to the I/O pad 114 through the I/O opening 126. The seed layer 134 may include, for example, a sputtered adhesion layer of titanium tungsten which contacts the I/O pad 114 and a sputtered plating seed layer of copper on the adhesion layer. The seed layer 134 covers the IR-absorbing seal 112 and any exposed overlying dielectric layer 104.

Figure 2F:
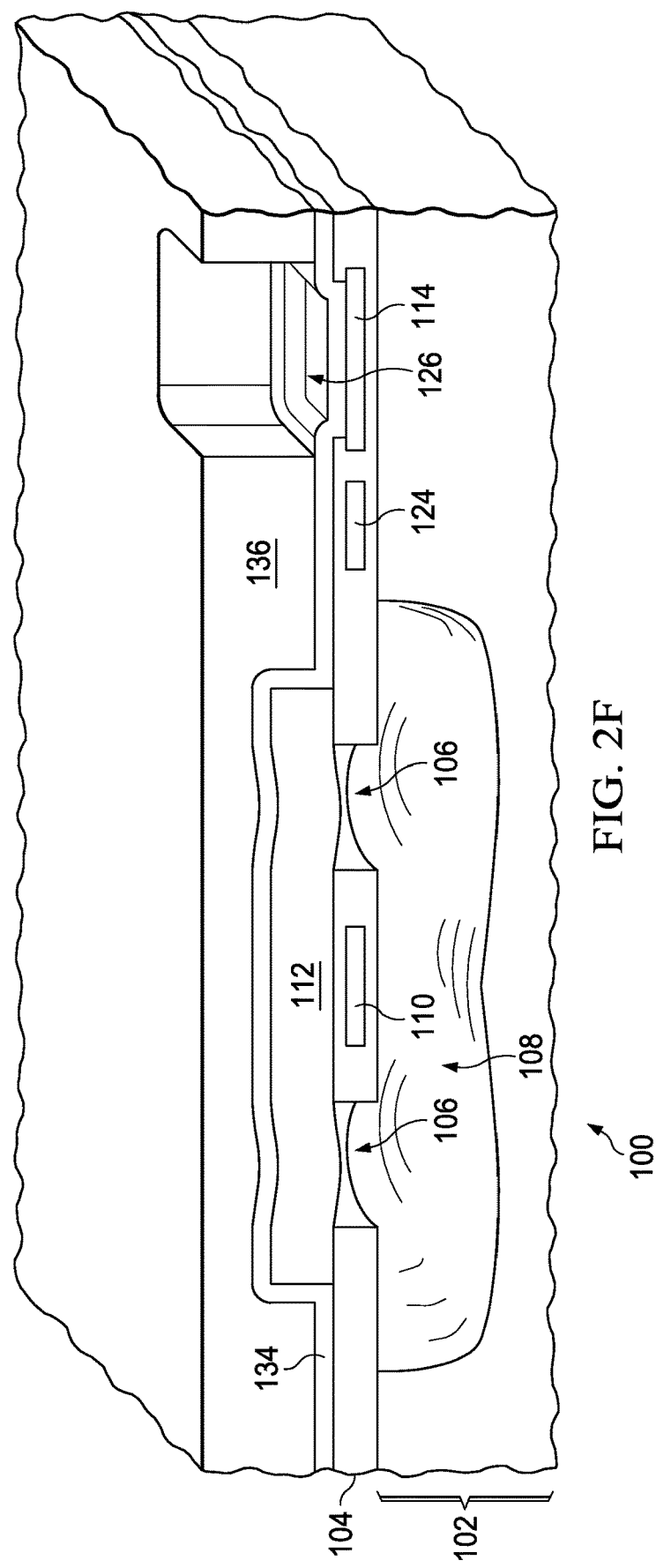

Referring to FIG. 2F, a plating mask 136 is formed over the seed layer 134 so as to expose the seed layer 134 in the I/O opening 126. The plating mask 136 may include 5 to 20 microns of photoresist and be formed by a photolithographic operation. The plating mask 136 covers the IR-absorbing seal 112 and any exposed overlying dielectric layer 104.

Figure 2G:
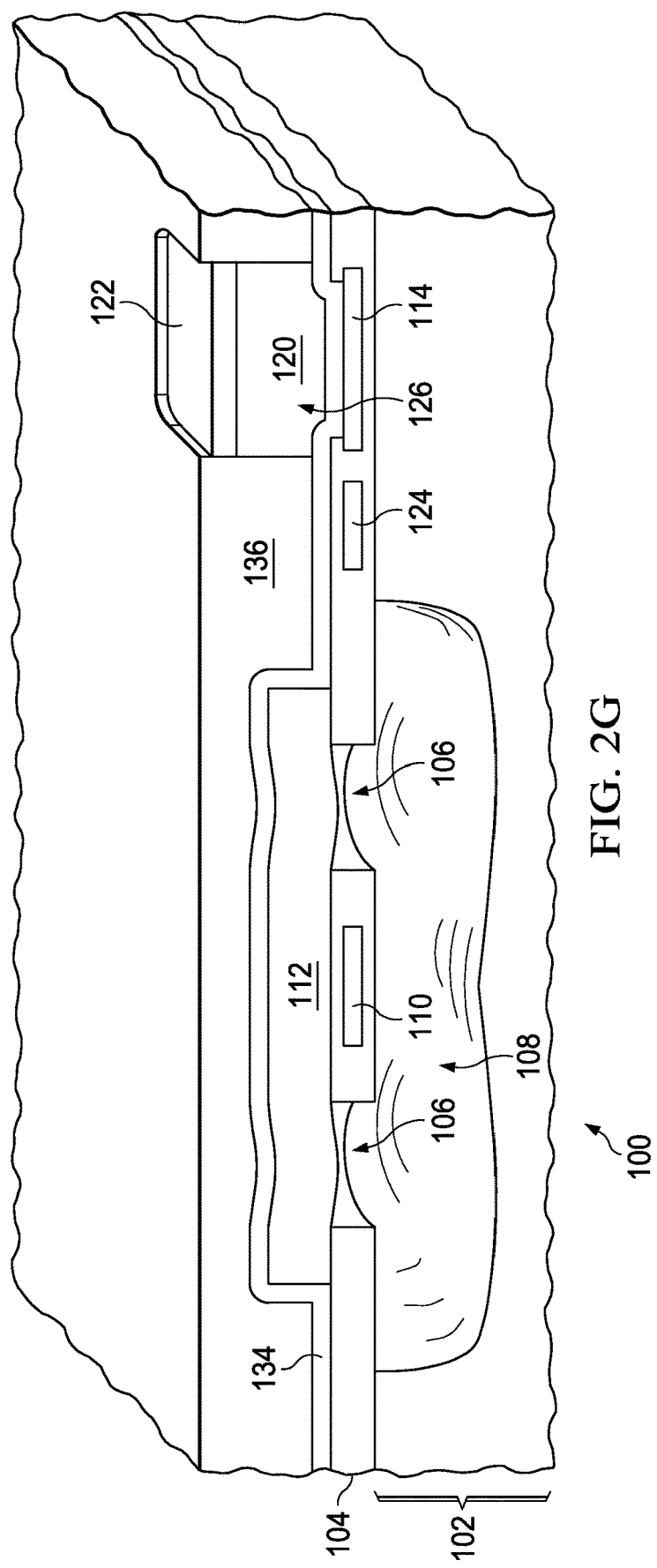

Referring to FIG. 2G, an electroplating operation is performed which forms the plated copper bump 120 and the plated metal cap layer 122 on the seed layer 134 in the I/O opening 126. Metal does not plate on the seed layer 134 in areas covered by the plating mask 136. A thickness of the plated copper bump 120 may be, for example, within 1 to 2 microns of the thickness of the plating mask 136. The plated metal cap layer 122 may include, for example, a layer of electroplated nickel 1 to 2 microns thick on the plated copper bump 120 and a plated palladium layer 100 to 500 nanometers thick on the plated nickel layer.

Figure 2H:
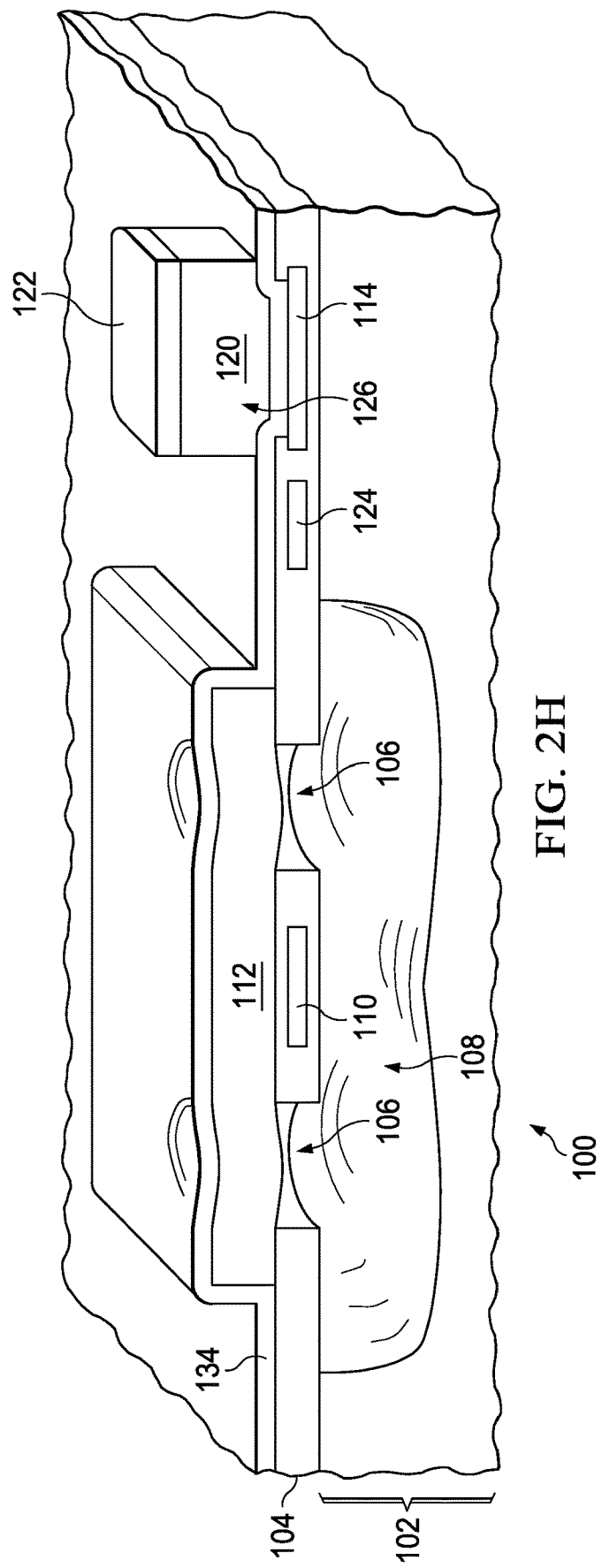

Referring to FIG. 2H, a plating mask strip operation is performed which removes the plating mask 136 from the MEMS IR sensor 100. The access holes 106 remain covered by the IR-absorbing seal 112 during the plating mask strip operation. The plating mask strip operation may dissolve the plating mask 136 in a strong solvent, for example N-methylpyrrolidinone, commonly referred to as NMP, at 95° C. Forming the IR-absorbing seal 112 of materials which are resistant to solvents may advantageously reduce deformation or peeling of the IR-absorbing seal 112 during the plating mask strip operation.

Figure 2I:
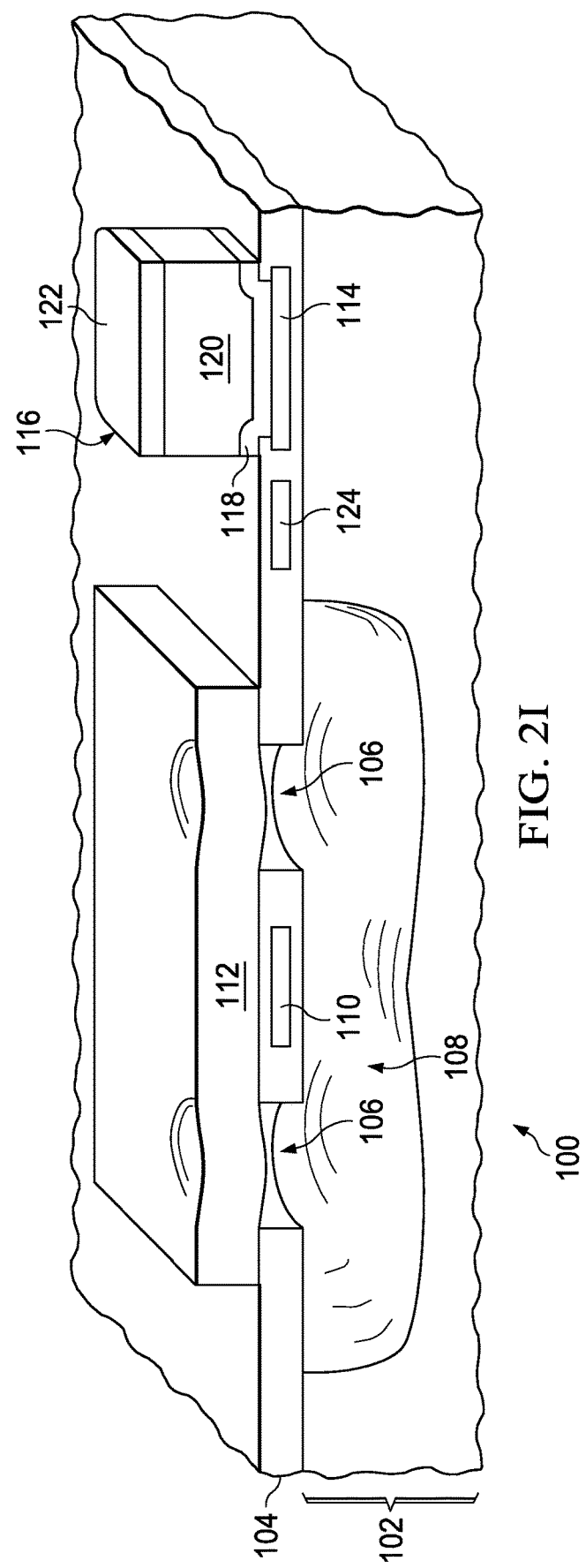

Referring to FIG. 2I, a seed layer strip operation is performed which removes the seed layer 134 from the MEMS IR sensor 100 outside of the plated I/O bump 116 to leave the bump seed layer 118 under the plated copper bump 120. The seed layer strip operation may include exposing the MEMS IR sensor 100 to strong oxidizing chemicals, for example 30 percent hydrogen peroxide at 100° C. The access holes 106 remain covered by the IR-absorbing seal 112 during the seed layer strip operation. Forming the IR-absorbing seal 112 of materials which are resistant to oxidizing chemicals may advantageously reduce deformation or peeling of the IR-absorbing seal 112 during the plating mask strip operation.

Figure 3A:
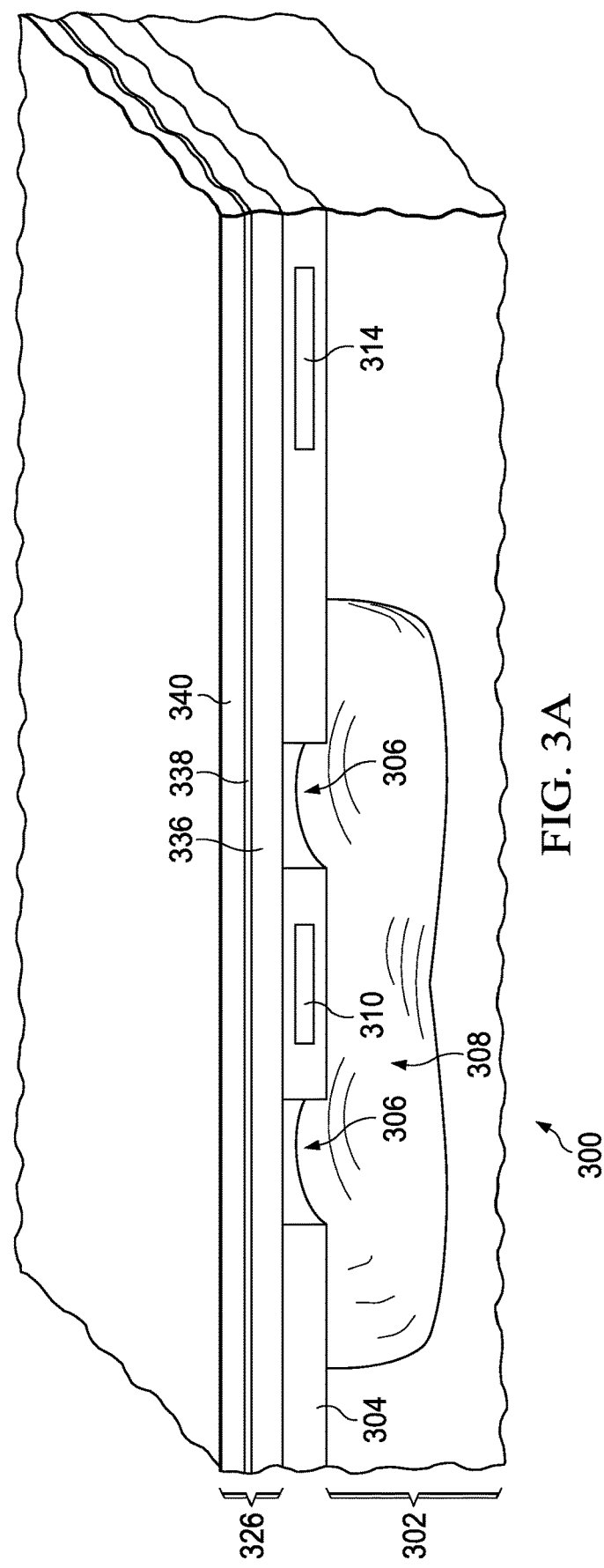
FIG. 3A through FIG. 3G are cross sections of a MEMS IR sensor formed according to another embodiment, depicted in successive stages of fabrication.

FIG. 3A through FIG. 3G are cross sections of a MEMS IR sensor formed according to another embodiment, depicted in successive stages of fabrication. Referring to FIG. 3A, the MEMS IR sensor 300 is formed in and on a substrate 302, and an overlying dielectric layer 304 is formed over the substrate 302, as described in reference to FIG. 2A. The overlying dielectric layer 304 contains a temperature sensing component 310 and possibly an I/O pad 314 as described in reference to FIG. 2A. Access holes 306 are formed through the overlying dielectric layer 304 proximate to the temperature sensing component 310 and a cavity 308 is formed in the substrate 302 under the access holes 306, as described in reference to FIG. 2A.

An IR-absorbing sealing layer 326 is formed over the overlying dielectric layer 304, covering the access holes 306. The IR-absorbing sealing layer 326 has a layered structure and includes an adhesive material 336 such as epoxy contacting the overlying dielectric layer 304, an IR absorbing material 338 such as carbon particle impregnated epoxy, and possibly an optional overcoat layer 340 such as epoxy or polyimide at a top surface of the IR-absorbing sealing layer 326. The IR absorbing material 338 absorbs at least 50 percent of infrared energy incident on the IR-absorbing sealing layer 326 in a wavelength band of 8 to 10 microns. The IR-absorbing sealing layer 326 may be applied to the overlying dielectric layer 304, for example, as described in reference to FIG. 2B. The IR-absorbing sealing layer 326 is resistant to strong solvents and oxidizing chemicals.

Figure 3B:
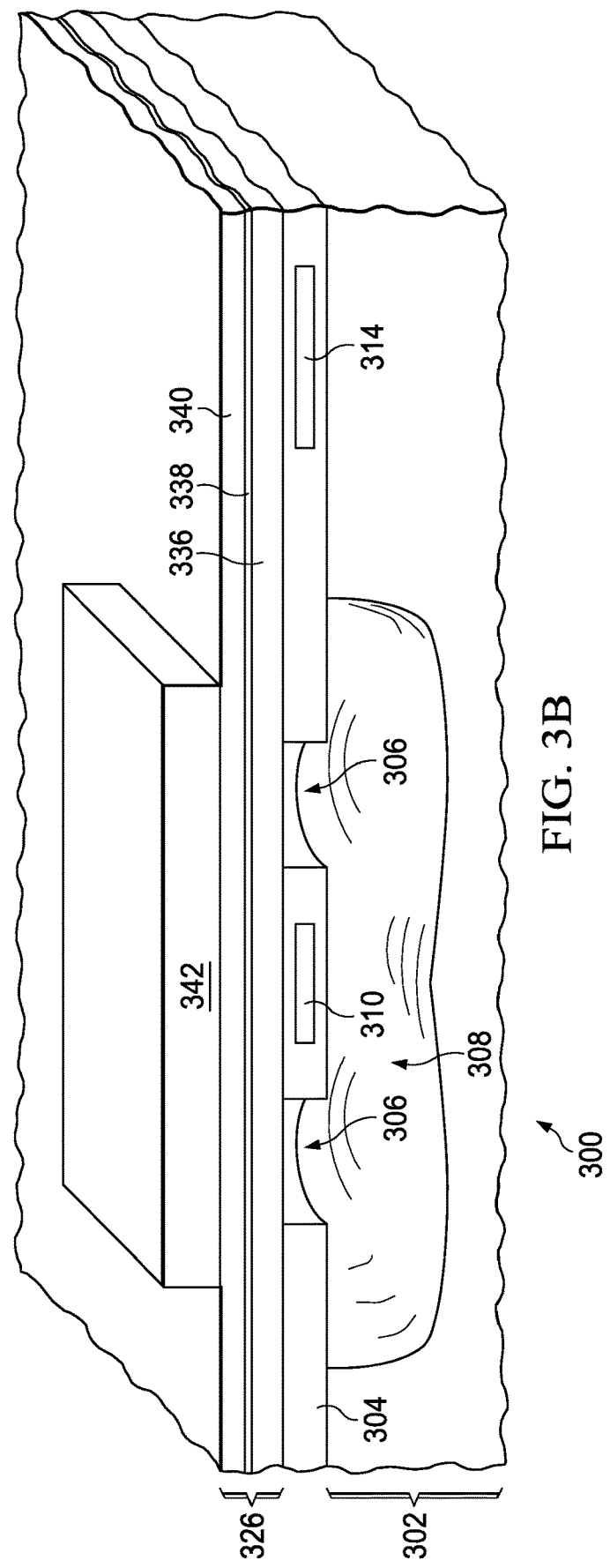

Referring to FIG. 3B, a seal etch mask 342 is formed over the IR-absorbing sealing layer 326 so as to cover an area defined for an IR-absorbing seal. The seal etch mask 342 may include photoresist and be formed by a photolithographic operation. The seal etch mask 342 may also include a hard mask layer, for example, silicon dioxide or silicon nitride. Forming the optional overcoat layer 340 at the top surface of the IR-absorbing sealing layer 326 may advantageously reduce deformation of the IR-absorbing sealing layer 326 during a develop step of the photolithographic operation that forms the seal etch mask 342.

Figure 3C:
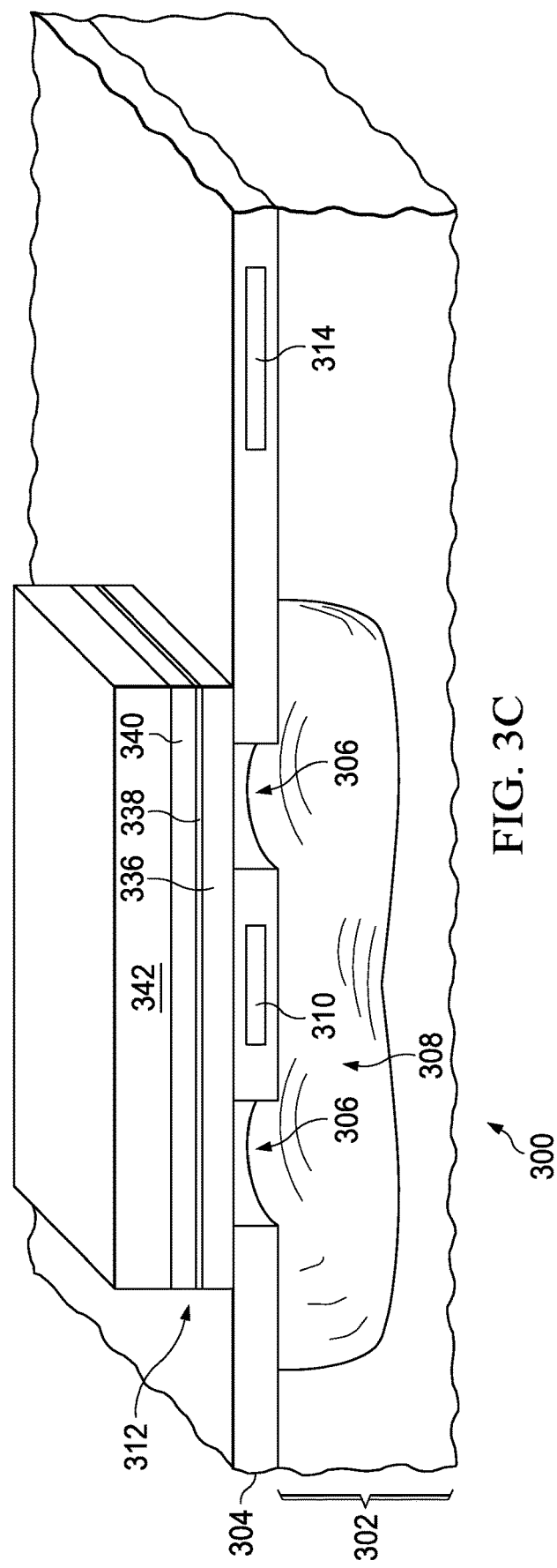

Referring to FIG. 3C, a seal etch process is performed which removes material from the IR-absorbing sealing layer 326 exposed by the seal etch mask 342 so as to form an IR-absorbing seal 312. The seal etch process may include an oxygen RIE step to remove organic material in the IR-absorbing sealing layer 326. The IR-absorbing seal 312 covers the access holes 306 as described in reference to FIG. 1.

Figure 3D:
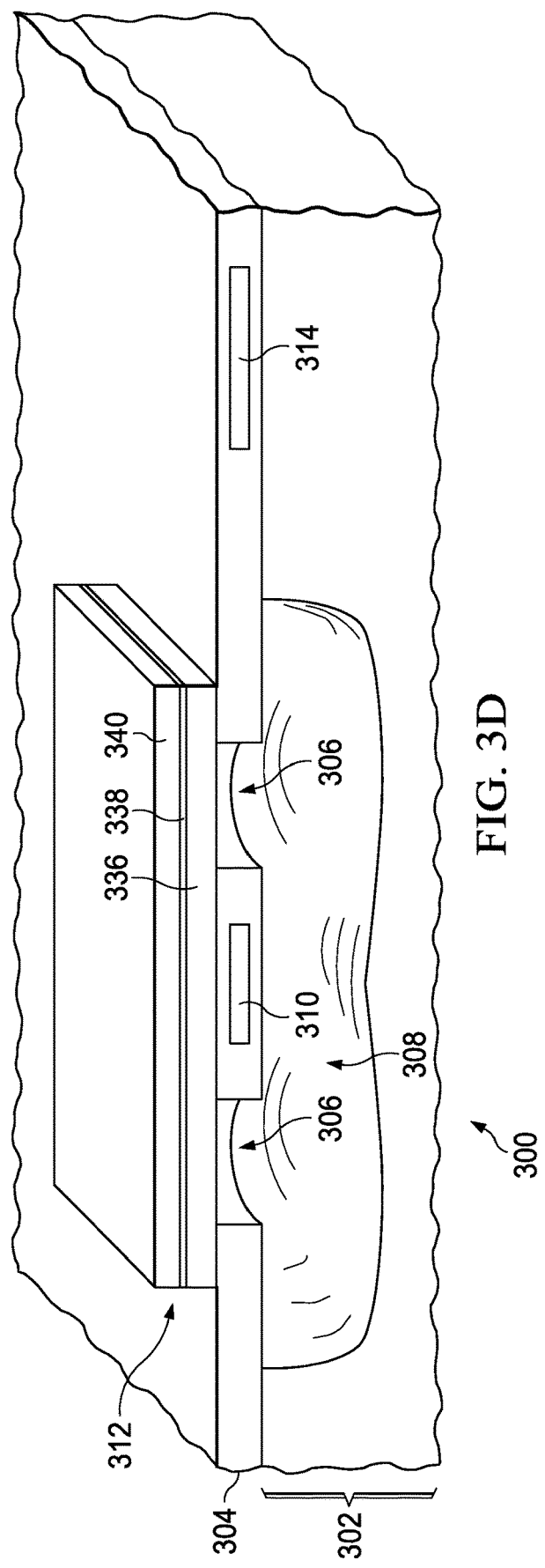

Referring to FIG. 3D, a seal mask strip process is performed which removes the seal etch mask 342 such that the IR-absorbing seal 312 continues to cover the access holes 306. The seal mask strip process may include solvents to dissolve the photoresist, if present, and an RIE step to remove the hard mask, if present, in the seal etch mask 342.

Figure 3E:
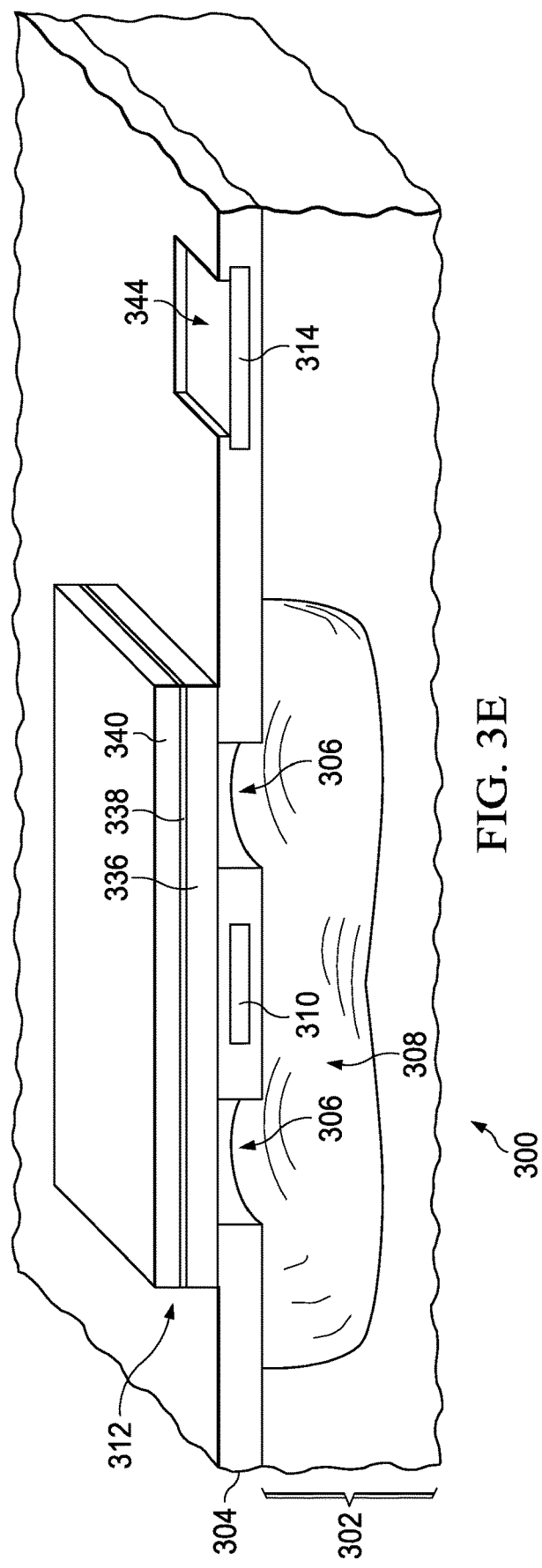
Figure 3F:
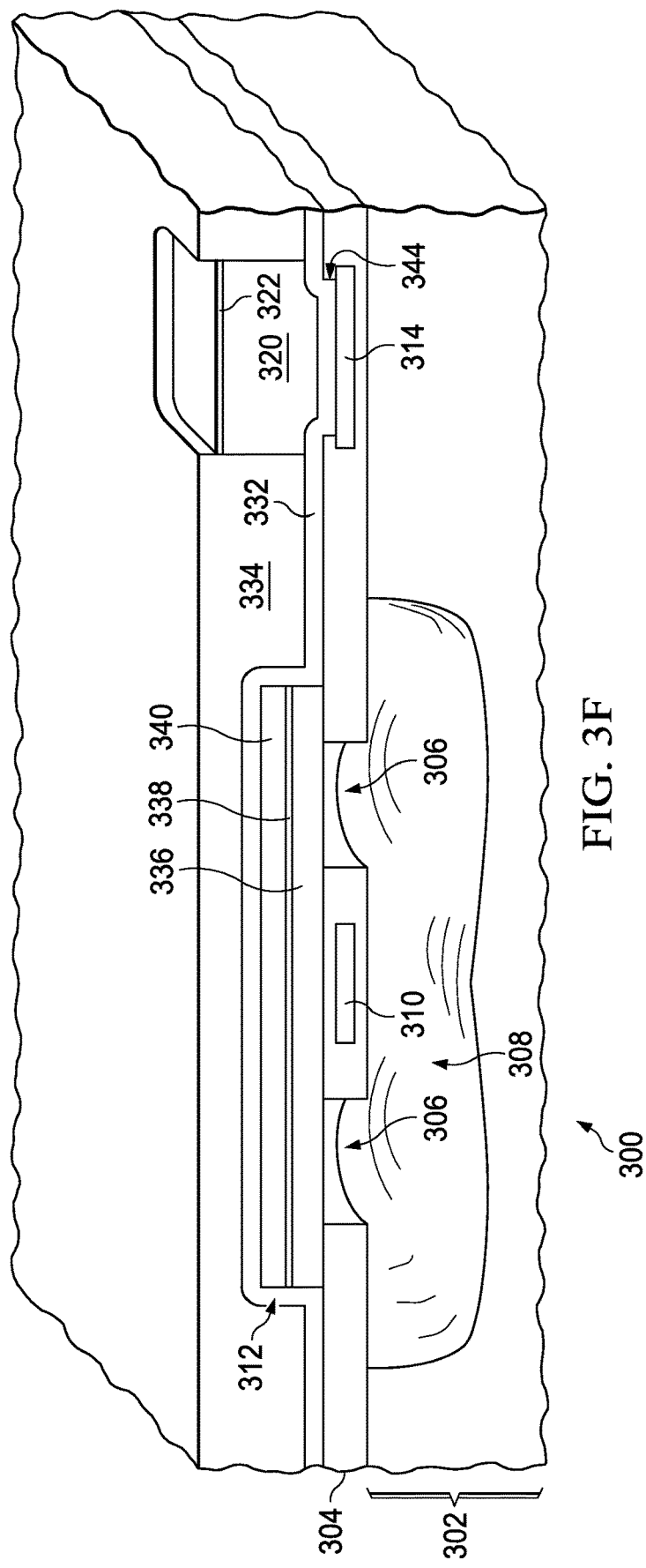
Figure 3G:
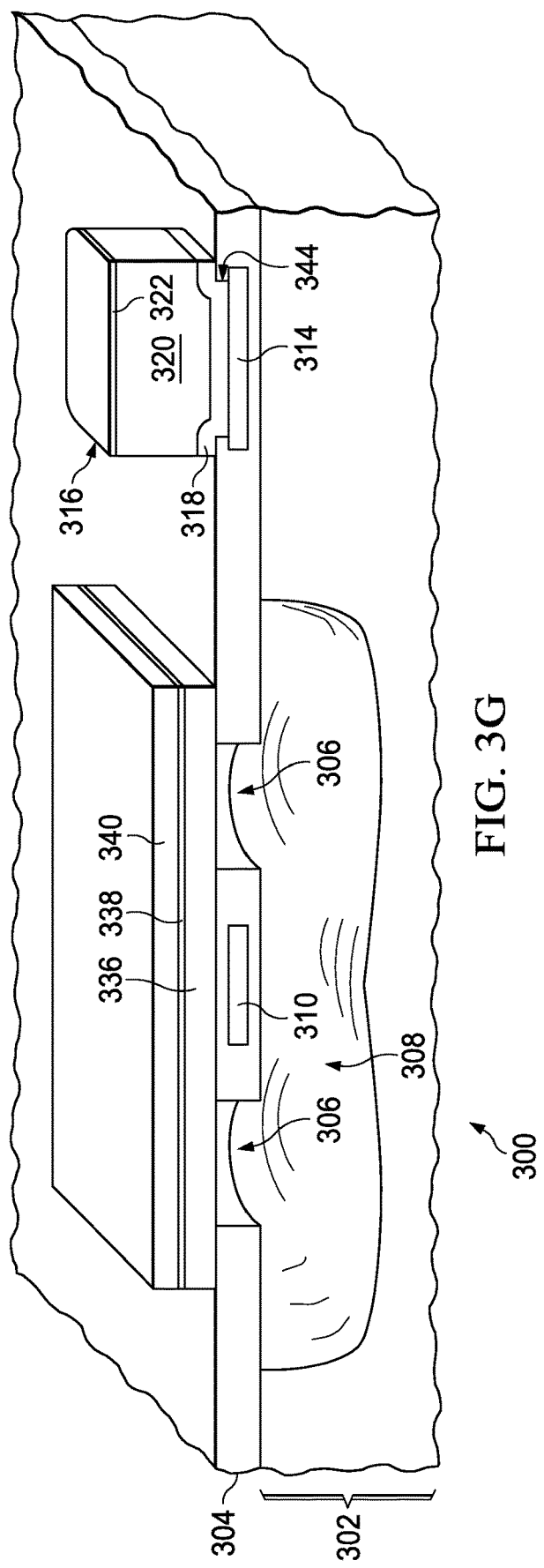

After formation of the IR-absorbing seal 312, a plated I/O bump may be formed on the I/O pad 314, if present, for example using the process sequence described in reference to FIG. 2E through FIG. 2I. FIG. 3E through FIG. 3G are cross sections of the MEMS IR sensor 300 depicting successive stages of forming the plated I/O bump. Referring to FIG. 3E, an I/O opening 344 is formed in the overlying dielectric layer 304 so as to expose the I/O pad 314. The I/O opening 344 may be formed, for example by forming an I/O etch mask over the MEMS IR sensor 300 which exposes an area over the I/O pad 314, performing an I/O opening etch process including an RIE step which removes material from the overlying dielectric layer 304 over the I/O pad 314 and subsequently removing the I/O etch mask by dissolving the I/O etch mask in solvent.

Referring to FIG. 3F, a metal seed layer 332 is formed over the MEMS IR sensor 300, so as to make electrical connection to the I/O pad 314 through the I/O opening 344, as described in reference to FIG. 2E. A plating mask 334 is formed over the seed layer 332 so as to expose the seed layer 332 in the I/O opening 344 as described in reference to FIG. 2F. An electroplating operation is performed which forms a plated copper bump 320 and a plated metal cap layer 322 on the seed layer 332 in the I/O opening 344, as described in reference to FIG. 2G.

Referring to FIG. 3G, a plating mask strip operation is performed which removes the plating mask 334 from the MEMS IR sensor 300 as described in reference to FIG. 2H. Forming the IR-absorbing seal 312 of materials which are resistant to solvents may advantageously reduce deformation or peeling of the IR-absorbing seal 312 during the plating mask strip operation. Subsequently, a seed layer strip operation is performed which removes the seed layer 332 from the MEMS IR sensor 300 outside of the plated I/O bump 316, to leave a bump seed layer 318 under the plated copper bump 320 as described in reference to FIG. 2I. Forming the IR-absorbing seal 312 of materials which are resistant to oxidizing chemicals may advantageously reduce deformation or peeling of the IR-absorbing seal 312 during the plating mask strip operation.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A microelectronic mechanical system (MEMS) infrared (IR) sensor, comprising:
    a substrate;
    an overlying dielectric layer disposed over said substrate, with access holes through said overlying dielectric layer;
    a cavity in said substrate under said access holes;
    a first temperature sensing component disposed over said cavity
    a second temperature sensing component disposed over a portion of the substrate not including the cavity; and
    an IR-absorbing seal disposed over said overlying dielectric layer so as to cover said access holes without extending into said cavity, said IR-absorbing seal including organic polymer material, so that said IR-absorbing seal absorbs at least 50 percent of infrared energy incident on said IR-absorbing seal in a wavelength band of 8 to 10 microns, wherein the IR-absorbing seal is located over the first temperature sensing component and not over the second temperature sensing component and wherein the IR-absorbing seal does not extend past the lateral edges of the cavity.

2. The MEMS IR sensor of claim 1, further including a plated input/output (I/O) bump, said plated I/O bump including:
    a bump seed layer making electrical connection to an I/O pad disposed in said overlying dielectric layer through an I/O opening in said overlying dielectric layer;
    a plated copper bump disposed on said bump seed layer; and
    a plated metal cap layer disposed on said plated copper bump.

3. The MEMS IR sensor of claim 1, in which said IR-absorbing seal has a homogenous structure, in which an adhesive material and an IR absorbing material are substantially uniformly distributed in the IR-absorbing seal.

4. The MEMS IR sensor of claim 3, in which said adhesive material and said IR absorbing material are a same epoxy material.

5. The MEMS IR sensor of claim 3, in which said IR-absorbing seal is 10 to 20 microns thick.

6. The MEMS IR sensor of claim 1, in which said temperature sensing component includes Seebeck junctions.

7. The MEMS IR sensor of claim 1, in which said substrate is silicon.

8. A microelectronic mechanical system (MEMS) infrared (IR) sensor, comprising:
    a substrate;
    an overlying dielectric layer disposed over said substrate, with access holes through said overlying dielectric layer;
    a cavity in said substrate under said access holes;
    a first temperature sensing component disposed over said cavity
    a second temperature sensing component disposed over a portion of the substrate not including the cavity; and
    an IR-absorbing seal disposed over said overlying dielectric layer so as to cover said access holes without extending into said cavity, said IR-absorbing seal including organic polymer material, so that said IR-absorbing seal absorbs at least 50 percent of infrared energy incident on said IR-absorbing seal in a wavelength band of 8 to 10 microns, wherein the IR-absorbing seal is located over the first temperature sensing component and not over the second temperature sensing component, in which said IR-absorbing seal has an IR absorbing material, and wherein the IR-absorbing seal protrudes into the access holes.

9. The MEMS IR sensor of claim 8, wherein the IR absorbing seal further includes a layer of adhesive material between a carbon particle material and the overlying dielectric layer and an overcoat layer on the carbon particle material.

10. The MEMS IR sensor of claim 9, wherein the overcoat layer comprises an epoxy.

11. The MEMS IR sensor of claim 9, wherein the overcoat layer comprises polyimide.

12. The MEMS IR sensor of claim 9, wherein the adhesive material comprises an epoxy.

* * * * *